United States Patent
Luo et al.

(10) Patent No.: US 12,074,174 B2
(45) Date of Patent: Aug. 27, 2024

(54) ARRAY SUBSTRATE AND MANUFACTURING METHOD THEREOF AND DISPLAY PANEL

(71) Applicant: Shenzhen China Star Optoelectronics Semiconductor Display Technology Co., Ltd., Shenzhen (CN)

(72) Inventors: Chuanbao Luo, Shenzhen (CN); Jiangbo Yao, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/622,182

(22) PCT Filed: Dec. 10, 2021

(86) PCT No.: PCT/CN2021/137154
§ 371 (c)(1),
(2) Date: Dec. 22, 2021

(87) PCT Pub. No.: WO2023/097752
PCT Pub. Date: Jun. 8, 2023

(65) Prior Publication Data
US 2024/0030241 A1   Jan. 25, 2024

(30) Foreign Application Priority Data
Dec. 2, 2021   (CN) .......................... 202111460405.X (51) Int. Cl.
*H01L 27/12*   (2006.01)
(52) U.S. Cl.
CPC ...... *H01L 27/1248* (2013.01); *H01L 27/1259* (2013.01)

(58) Field of Classification Search
None
See application file for complete search history.

(56) References Cited

U.S. PATENT DOCUMENTS

| 7,605,399 B2 | 10/2009 | Kim et al. |
| 2015/0153599 A1* | 6/2015 | Yamazaki .......... H10K 59/1213 257/43 |
| 2017/0221925 A1* | 8/2017 | Lou ....................... H01L 21/465 |

FOREIGN PATENT DOCUMENTS

| CN | 103022146 A | 4/2013 |
| CN | 106783733 A | 5/2017 |

(Continued)

OTHER PUBLICATIONS

International Search Report in International application No. PCT/CN2021/137154, mailed on Aug. 25, 2022.

(Continued)

*Primary Examiner* — Bo B Jang
(74) *Attorney, Agent, or Firm* — PV IP PC; Wei Te Chung; Zhigang Ma (57) ABSTRACT

An array substrate and a manufacturing method thereof, and a display panel are disclosed. The array substrate includes a substrate, a switching transistor, and a driving transistor. The switching transistor and the driving transistor are disposed on the substrate. An orthogonal projection of the switching transistor on the substrate is staggered from an orthogonal projection of the driving transistor on the substrate. A mobility of the switching transistor is greater than a mobility of the driving transistor, and a threshold voltage of the driving transistor is less than a threshold voltage of the switching transistor.

14 Claims, 5 Drawing Sheets

(56) References Cited

FOREIGN PATENT DOCUMENTS

| | | | |
|---|---|---|---|
| CN | 107004682 A | 8/2017 | |
| CN | 108320705 A | 7/2018 | |
| CN | 110164875 A | 8/2019 | |
| CN | 110190063 A | 8/2019 | |
| CN | 110265482 A | 9/2019 | |
| CN | 110473494 A | 11/2019 | |
| CN | 110880518 A | 3/2020 | |
| CN | 112310151 A | 2/2021 | |
| CN | 113540165 A | 10/2021 | |
| CN | 113629085 A | 11/2021 | |
| WO | 2020085584 A1 | 4/2020 | |

OTHER PUBLICATIONS

Written Opinion of the International Search Authority in International application No. PCT/CN2021/137154, mailed on Aug. 25, 2022.

Chinese Office Action issued in corresponding Chinese Patent Application No. 202111460405.X dated Feb. 11, 2023, pp. 1-8.

\* cited by examiner

ARRAY SUBSTRATE AND MANUFACTURING METHOD THEREOF AND DISPLAY PANEL

CROSS-REFERENCE TO RELATED APPLICATION

This application is a national phase application under 35 U.S.C. § 371 of PCT Application No. PCT/CN2021/137154, filed Dec. 10, 2021, which claims priority to Chinese Application No. 202111460405.X, filed Dec. 2, 2021, the contents of which are incorporated herein by reference in their entirety.

FIELD OF INVENTION

The present disclosure relates to the field of display technologies, and in particular, to an array substrate and a manufacturing method thereof, and a display panel.

BACKGROUND OF INVENTION

The low temperature poly-silicon (LTPS) thin film transistor (TFT) is widely used in small-sized displays such as mobile phones and tablet computers due to the high-mobility driving performance, but the LTPS TFT has a relatively large leakage current. However, the metal oxide TFT reduces the refresh rate due to a relatively small leakage current, but the mobility is lower than that of the LTPS TFT.

In order to resolve the problems of low mobility and poor stability of large-sized devices, the LTPS TFT and the metal oxide TFTs are usually combined, so as to obtain the low-temperature poly-silicon oxide (LTPO), thereby improving the mobility and the stability of the device. However, the process of manufacturing the LTPO TFT is complex, the LTPS TFT and the indium gallium zinc oxide (IGZO) TFT are required to be manufactured separately, and the large-area uniformity of the LTPS TFT is relatively poor. In order to be compatible with the LTPS TFT process, it is also difficult to apply the LTPO TFT to large-size products or the mass production of the line panel factory in the current big era.

SUMMARY OF INVENTION

Embodiments of the present disclosure provide an array substrate and a manufacturing method thereof, and a display panel, so as to improve the performance of the array substrate.

The present disclosure provides an array substrate, including:
a substrate;
a switching transistor and a driving transistor disposed on the substrate, wherein an orthogonal projection of the switching transistor on the substrate is staggered from an orthogonal projection of the driving transistor on the substrate, and
a mobility of the switching transistor is greater than a mobility of the driving transistor, and a threshold voltage of the driving transistor is less than a threshold voltage of the switching transistor.

Optionally, in some embodiments of the present disclosure, the mobility of the switching transistor is 1.5-3 times the mobility of the driving transistor, and the threshold voltage of the driving transistor is $1/3$-$1/2$ of the threshold voltage of the switching transistor.

Optionally, in some embodiments of the present disclosure, the switching transistor includes a first gate electrode and a second gate electrode connected to the first gate electrode, and the driving transistor includes a first oxide semiconductor portion, wherein the first oxide semiconductor portion is doped with one or a combination of more of electronegative metal and an electronegative compound.

Optionally, in some embodiments of the present disclosure, the first oxide semiconductor portion is doped with one or a combination of more of rare-earth metal and a fluorine-based compound.

Optionally, in some embodiments of the present disclosure, the driving transistor and the switching transistor are both disposed in a same layer on the substrate, and the substrate includes a display area and a non-display area disposed adjacent to each other, wherein the driving transistor is located in the display area, and the switching transistor is located in the non-display area.

Optionally, in some embodiments of the present disclosure, the non-display area includes a bridge area and a main area that are disposed adjacent to each other, wherein the bridge area is located on a side of the main area away from the display area. The first gate electrode includes a first sub-gate electrode and a first light-shielding portion spaced apart from each other. The first sub-gate electrode is located in the bridge area of the substrate, and the first light-shielding portion is located in the main area of the substrate. The second gate electrode includes a second sub-gate electrode and a third sub-gate electrode spaced apart from each other. The second sub-gate electrode is located in the bridge area and above the first sub-gate electrode, the first sub-gate electrode is connected to the second sub-gate electrode, and the third sub-gate electrode is located in the main area and above the first light-shielding portion.

Optionally, in some embodiments of the present disclosure, the switching transistor further includes a second oxide semiconductor portion, an additional gate insulating portion, a first gate insulating portion, a first source electrode, and a first drain electrode, and the driving transistor further includes a second light-shielding portion, a second gate insulating portion, a third gate electrode, a second source electrode, and a second drain electrode.

The first sub-gate electrode, the first light-shielding portion, and the second light-shielding portion are all disposed in a same layer on the substrate and spaced apart from each other, the first sub-gate electrode is located in the bridge area, the first light-shielding portion is located in the main area, and the second light-shielding portion is located in the display area.

A buffer layer covers the first sub-gate electrode, the first light-shielding portion, the second light-shielding portion, and the substrate.

The first oxide semiconductor portion and the second oxide semiconductor portion are both disposed in a same layer on the buffer layer and spaced apart from each other. The second oxide semiconductor portion is located in the main area, and the first oxide semiconductor portion is located in the display area.

The additional gate insulating portion, the first gate insulating portion, and the second gate insulating portion are disposed in a same layer and spaced apart from each other. The additional gate insulating portion is disposed on the buffer layer and located in the bridge area. The first gate insulating portion is disposed on the second oxide semiconductor portion, and the second gate insulating portion is disposed on the first oxide semiconductor portion.

The second sub-gate electrode, the third sub-gate electrode, and the third gate electrode are disposed in a same layer and spaced apart from each other, the second sub-gate electrode is disposed on the additional gate insulating portion, the third sub-gate electrode is disposed on the first gate insulating portion, and the third gate electrode is disposed on the second gate insulating portion.

An interlayer dielectric layer covers the buffer layer, the additional gate insulating portion, the second oxide semiconductor portion, the first oxide semiconductor portion, the second sub-gate electrode, the first gate insulating portion, the second gate insulating portion, the third sub-gate electrode, and the third gate electrode.

A connecting portion, the first source electrode, the first drain electrode, the second source electrode, and the second drain electrode are all disposed in a same layer on the interlayer dielectric layer and spaced apart from each other. The connecting portion is located in the bridge area and connects the first sub-gate electrode to the second sub-gate electrode. The first source electrode and the first drain electrode are respectively connected to two sides of the second oxide semiconductor portion, the second source electrode is connected to one side of the first oxide semiconductor portion and the second light-shielding portion, and the second drain electrode is connected to an other side of the first oxide semiconductor portion.

Optionally, in some embodiments of the present disclosure, the array substrate further includes a passivation layer and a first electrode. The passivation layer covers the interlayer dielectric layer, the connecting portion, the first source electrode, the first drain electrode, the second source electrode, and the second drain electrode. The first electrode is disposed on the passivation layer, and the first electrode is connected to the second source electrode.

Optionally, in some embodiments of the present disclosure, the second oxide semiconductor portion is doped with one or a combination of two of electronegative metal and an electronegative compound, and is doped with the one or the combination of more of rare-earth metal and a fluorine-based compound.

Optionally, in some embodiments of the present disclosure, mass percentages of the rare-earth metal and the fluorine-based compound in the first oxide semiconductor portion and the second oxide semiconductor portion range from 0.2% to 5%.

Optionally, in some embodiments of the present disclosure, the switching transistor further includes a second oxide semiconductor portion, a first gate insulating portion, a second gate insulating portion, a third gate electrode, a first source electrode, a first drain electrode, a second source electrode, a second drain electrode, and a second light-shielding portion.

The first gate electrode and the second light-shielding portion are both disposed in a same layer on the substrate and spaced apart from each other, the first gate electrode is located in the non-display area, and the second light-shielding portion is located in the display area.

A buffer layer covers the first gate electrode and the second light-shielding portion.

The first oxide semiconductor portion and the second oxide semiconductor portion are both disposed in a same layer on the buffer layer and spaced apart from each other, the second oxide semiconductor portion is located above the first gate electrode, and the first oxide semiconductor portion is located above the second light-shielding portion.

The first gate insulating portion and the second gate electrode are sequentially stacked on the second oxide semiconductor portion.

The second gate insulating portion and the third gate electrode are sequentially stacked on the first oxide semiconductor portion.

An interlayer dielectric layer covers the buffer layer, the first oxide semiconductor portion, the second oxide semiconductor portion, the first gate insulating portion, the second gate insulating portion, the second gate electrode, and the third gate electrode.

The first source electrode, the first drain electrode, the second source electrode, and the second drain electrode are all disposed in a same layer on the interlayer dielectric layer and spaced apart from each other, the first source electrode and the first drain electrode are connected to the second oxide semiconductor portion, the second source electrode is connected to one side of the first oxide semiconductor portion and the second light-shielding portion, and the second drain electrode is connected to an other side of the first oxide semiconductor portion.

A passivation layer covers the interlayer dielectric layer, the first source electrode, the first drain electrode, the second source electrode, and the second drain electrode.

The connecting portion is disposed on the passivation layer and located above the first source electrode or the first drain electrode, and connects the first gate electrode to the second gate electrode.

Correspondingly, the present disclosure further provides a method for manufacturing an array substrate. The method includes:

providing a substrate;

forming a switching transistor and a driving transistor on the substrate, wherein an orthogonal projection of the switching transistor on the substrate is staggered from an orthogonal projection of the driving transistor on the substrate, and a mobility of the switching transistor is greater than a mobility of the driving transistor, and a threshold voltage of the driving transistor is less than a threshold voltage of the switching transistor.

Optionally, in some embodiments of the present disclosure, the driving transistor includes a first oxide semiconductor portion. The first oxide semiconductor portion is doped with one or a combination of two of electronegative metal and an electronegative compound.

Correspondingly, the present disclosure further provides a display panel. The display panel includes the array substrate. The array substrate includes:

a substrate;

a switching transistor and a driving transistor disposed on the substrate, wherein an orthogonal projection of the switching transistor on the substrate is staggered from an orthogonal projection of the driving transistor on the substrate, and a mobility of the switching transistor is greater than a mobility of the driving transistor, and a threshold voltage of the driving transistor is less than a threshold voltage of the switching transistor.

Optionally, in some embodiments of the present disclosure, the mobility of the switching transistor is 1.5-3 times the mobility of the driving transistor, and the threshold voltage of the driving transistor is ⅓-½ of the threshold voltage of the switching transistor.

Optionally, in some embodiments of the present disclosure, the switching transistor includes a first gate electrode and a second gate electrode connected to the first gate electrode, and the driving transistor includes a first oxide semiconductor portion, wherein the first oxide semiconductor portion is doped with one or a combination of two of electronegative metal and an electronegative compound.

Optionally, in some embodiments of the present disclosure, the first oxide semiconductor portion is doped with one or a combination of more of rare-earth metal and a fluorine-based compound.

Optionally, in some embodiments of the present disclosure, the driving transistor and the switching transistor are both disposed in a same layer on the substrate, and the substrate includes a display area and a non-display area disposed adjacent to each other, wherein the driving transistor is located in the display area, and the switching transistor is located in the non-display area.

Optionally, in some embodiments of the present disclosure, the non-display area includes a bridge area and a main area that are disposed adjacent to each other, wherein the bridge area is located on a side of the main area away from the display area. The first gate electrode includes a first sub-gate electrode and a first light-shielding portion spaced apart from each other. The first sub-gate electrode is located in the bridge area of the substrate, and the first light-shielding portion is located in the main area of the substrate. The second gate electrode includes a second sub-gate electrode and a third sub-gate electrode spaced apart from each other. The second sub-gate electrode is located in the bridge area and above the first sub-gate electrode, the first sub-gate electrode is connected to the second sub-gate electrode, and the third sub-gate electrode is located in the main area and above the first light-shielding portion.

Optionally, in some embodiments of the present disclosure, the switching transistor further includes a second oxide semiconductor portion, an additional gate insulating portion, a first gate insulating portion, a first source electrode, and a first drain electrode, and the driving transistor further includes a second light-shielding portion, a second gate insulating portion, a third gate electrode, a second source electrode, and a second drain electrode.

The first sub-gate electrode, the first light-shielding portion, and the second light-shielding portion are all disposed in a same layer on the substrate and spaced apart from each other, the first sub-gate electrode is located in the bridge area, the first light-shielding portion is located in the main area, and the second light-shielding portion is located in the display area.

A buffer layer covers the first sub-gate electrode, the first light-shielding portion, the second light-shielding portion, and the substrate.

The first oxide semiconductor portion and the second oxide semiconductor portion are both disposed in a same layer on the buffer layer and spaced apart from each other. The second oxide semiconductor portion is located in the main area, and the first oxide semiconductor portion is located in the display area.

The additional gate insulating portion, the first gate insulating portion, and the second gate insulating portion are disposed in a same layer and spaced apart from each other. The additional gate insulating portion is disposed on the buffer layer and located in the bridge area. The first gate insulating portion is disposed on the second oxide semiconductor portion, and the second gate insulating portion is disposed on the first oxide semiconductor portion.

The second sub-gate electrode, the third sub-gate electrode, and the third gate electrode are disposed in a same layer and spaced apart from each other, the second sub-gate electrode is disposed on the additional gate insulating portion, the third sub-gate electrode is disposed on the first gate insulating portion, and the third gate electrode is disposed on the second gate insulating portion.

An interlayer dielectric layer covers the buffer layer, the additional gate insulating portion, the second oxide semiconductor portion, the first oxide semiconductor portion, the second sub-gate electrode, the first gate insulating portion, the second gate insulating portion, the third sub-gate electrode, and the third gate electrode.

A connecting portion, the first source electrode, the first drain electrode, the second source electrode, and the second drain electrode are all disposed in a same layer on the interlayer dielectric layer and spaced apart from each other. The connecting portion is located in the bridge area and connects the first sub-gate electrode to the second sub-gate electrode. The first source electrode and the first drain electrode are respectively connected to two sides of the second oxide semiconductor portion, the second source electrode is connected to one side of the first oxide semiconductor portion and the second light-shielding portion, and the second drain electrode is connected to an other side of the first oxide semiconductor portion.

Beneficial Effects

The present disclosure discloses an array substrate and a manufacturing method thereof, and a display panel. The array substrate includes a substrate, a switching transistor, and a driving transistor. The switching transistor and the driving transistor are disposed on the substrate. An orthogonal projection of the switching transistor on the substrate is staggered from an orthogonal projection of the driving transistor on the substrate. A mobility of the switching transistor is greater than a mobility of the driving transistor, and a threshold voltage of the driving transistor is less than a threshold voltage of the switching transistor. Since the mobility of the transistor used in the switching transistor is greater than the mobility of the driving transistor, and the threshold voltage of the transistor used in the driving transistor is less than the threshold voltage of the switching transistor, the mobility of the switching transistor is improved, and the stability of the driving transistor is enhanced, thereby improving the performance of the array substrate.

BRIEF DESCRIPTION OF DRAWINGS

To describe technical solutions in embodiments of the present disclosure more clearly, the following briefly introduces the accompanying drawings required for describing the embodiments. Apparently, the accompanying drawings in the following description show only some embodiments of the present disclosure, and a person skilled in the art may still derive other accompanying drawings from these accompanying drawings without creative efforts.

DETAILED DESCRIPTION OF PREFERRED EMBODIMENTS

The technical solutions in the embodiments of the present disclosure are clearly and completely described in the following with reference to the accompanying drawings in the embodiments of the present disclosure. Apparently, the embodiments to be described are merely some embodiments of the present disclosure rather than all of the embodiments. All other embodiments obtained by a person skilled in the art based on the embodiments of the present disclosure without creative efforts shall fall within the protection scope of the present disclosure. In addition, it should be understood that the specific implementations described herein are merely used for describing and illustrating the present disclosure rather than limiting the present disclosure. In the present disclosure, without the contrary explanation, the directional terms such as "upper" and "lower" are usually used to refer to the top and bottom of the device in actual use or operating condition, specifically refer to the orientation of the drawing in the accompanying drawings; and "inside" and "outside" refer to the inside and outside of the contour of the corresponding component. In the present disclosure, reaction may be a chemical reaction or a physical reaction.

The present disclosure discloses an array substrate and a manufacturing method thereof, and a display panel. The array substrate includes a substrate, a switching transistor, and a driving transistor. The switching transistor and the driving transistor are disposed on the substrate. An orthogonal projection of the switching transistor on the substrate is staggered from an orthogonal projection of the driving transistor on the substrate. A mobility of the switching transistor is greater than a mobility of the driving transistor, and a threshold voltage of the driving transistor is less than a threshold voltage of the switching transistor.

In the present disclosure, since the mobility of the transistor used in the switching transistor is greater than the mobility of the driving transistor, and the threshold voltage of the transistor used in the driving transistor is less than the threshold voltage of the switching transistor, the mobility of the switching transistor is improved, and the stability of the driving transistor is enhanced, thereby improving the performance of the array substrate.

Figure 1:
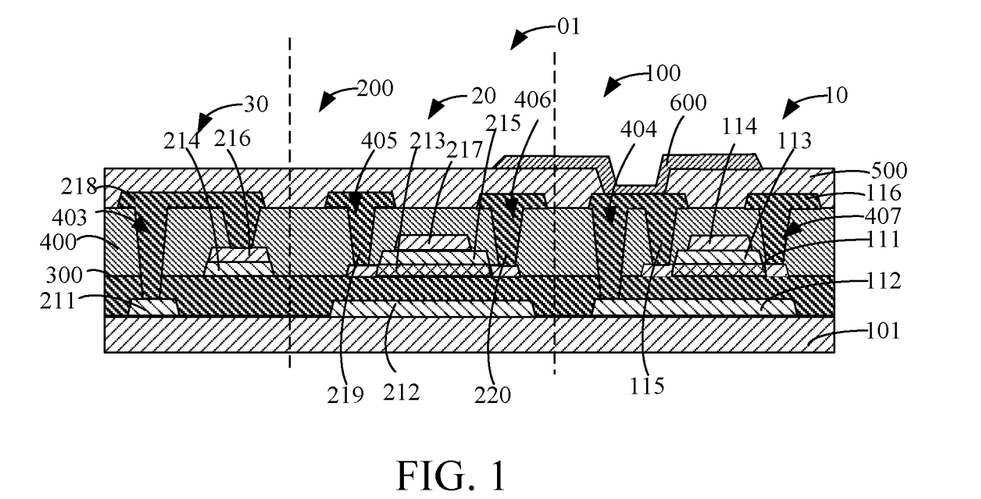
FIG. 1 is a schematic diagram of a first structure of an array substrate according to an embodiment of the present disclosure.
Figure 2:
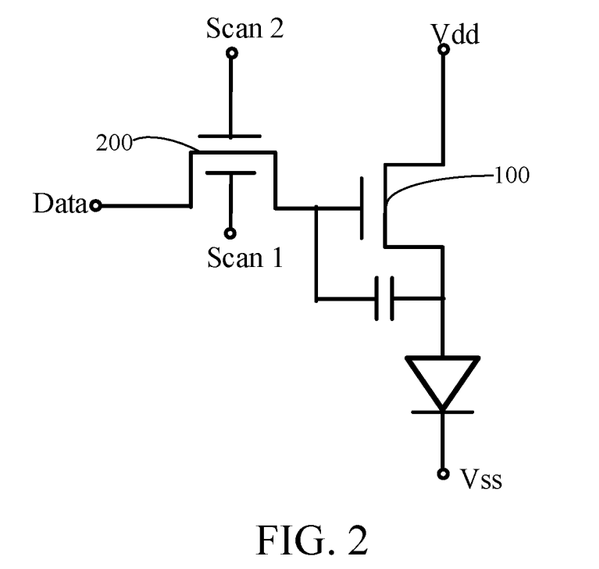
FIG. 2 is a schematic diagram of a circuit structure of an array substrate according to an embodiment of the present disclosure.

Detailed descriptions are separately provided below:

Refer to FIGS. 1 and 2. FIG. 1 is a schematic diagram of a first structure of an array substrate according to an embodiment of the present disclosure. FIG. 2 is a schematic diagram of a circuit structure of an array substrate according to an embodiment of the present disclosure. The array substrate 01 includes a substrate 101, a switching transistor 200, and a driving transistor 100. The switching transistor 200 and the driving transistor 100 are disposed on the substrate 101. An orthogonal projection of the switching transistor 200 on the substrate 101 is staggered from an orthogonal projection of the driving transistor 100 on the substrate 101. A mobility of the switching transistor 200 is greater than a mobility of the driving transistor 100, and a threshold voltage of the driving transistor 100 is less than a threshold voltage of the switching transistor 200.

In detail, the driving transistor 100 and the switching transistor 200 are both disposed on the substrate 101. The substrate 101 includes a display area 10 and a non-display area disposed adjacent to each other. The driving transistor 100 is located in the display area 10. The switching transistor 200 is located in the non-display area. The non-display area includes a bridge area 30 and a main area 20 disposed adjacent to each other. The bridge area 30 is located on a side of the main area 20 away from the display area 10.

In an embodiment, the mobility of the switching transistor 200 is 1.5-3 times the mobility of the driving transistor 100, and the threshold voltage of the driving transistor 100 is $\frac{1}{3}$-$\frac{1}{2}$ of the threshold voltage of the switching transistor 200. In detail, the mobility of the switching transistor 200 may be 1.5 times, 2 times, 2.3 times, or 3 times the mobility of the driving transistor 100, and the threshold voltage of the driving transistor 100 may be $\frac{1}{3}$, $\frac{4}{5}$, or $\frac{1}{2}$ of the threshold voltage of the switching transistor 200.

In the present disclosure, the mobility of the switching transistor 200 is set to 1.5-3 times the mobility of the driving transistor 100, and the threshold voltage of the driving transistor 100 is set to $\frac{1}{3}$-$\frac{1}{2}$ of the threshold voltage of the switching transistor 200. In this way, the driving transistor 100 is further caused to have high stability, and the switching transistor 200 is further caused to have high mobility, thereby improving the performance of the array substrate 01.

In an embodiment, the switching transistor 200 includes a first gate electrode and a second gate electrode connected to the first gate electrode, and the driving transistor 100 includes a first oxide semiconductor portion 111. The first oxide semiconductor portion 111 is doped with one or a combination of two of electronegative metal and an electronegative compound. That is to say, the first oxide semiconductor portion 111 is doped with one or a combination of more of rare-earth metal and a fluorine-based compound. The first gate electrode is disposed on the substrate 101. The first gate electrode includes a first sub-gate electrode 211 and a first light-shielding portion 212 spaced apart from each other. The first sub-gate electrode 211 is located in the bridge area 30 of the substrate 101. The first light-shielding portion 212 is located in the main area 20 of the substrate 101.

In an embodiment, the driving transistor 100 further includes a second light-shielding portion 112. The second light-shielding portion 112, the first light-shielding portion 212, and the first sub-gate electrode 211 are all disposed in a same layer on the substrate 101 and spaced apart from each other. The second light-shielding portion 112 is located in the display area 10.

In an embodiment, materials of the first sub-gate electrode 211, the first light-shielding portion 212, and the second light-shielding portion 112 are all conductive materials. The conductive material includes one or a combination of more of Mo, Ti, Cu, and Al.

A buffer layer 300 covers the first sub-gate electrode 211, the first light-shielding portion 212, the second light-shielding portion 112, and the substrate 101.

In an embodiment, a material of the buffer layer 300 includes one or a combination of more of silicon nitride and silicon oxide. The buffer layer 300 may include a plurality of layers.

In an embodiment, the switching transistor 200 further includes a second oxide semiconductor portion 213. The first oxide semiconductor portion 111 and the second oxide semiconductor portion 213 are both disposed in a same layer on the buffer layer 300 and spaced apart from each other. The second oxide semiconductor portion 213 is located in the main area 20. The first oxide semiconductor portion 111 is located in the display area 10.

In an embodiment, materials of the first oxide semiconductor portion 111 and the second oxide semiconductor portion 213 are metal oxide materials, and the metal oxide material includes one or a combination of more of IGZO, $Ga_2O_3$, ZnMgO, and $SnO_2$.

In an embodiment, the first oxide semiconductor portion 111 and the second oxide semiconductor portion 213 both include a body portion and conductor portions disposed on two sides of the body portion.

In the present disclosure, the oxide semiconductor portions of the switching transistor 200 and the driving transistor 100 are both formed of metal oxide, so as to avoid the problem of the increased difficulty of compatibility in the process of low temperature poly-silicon (LTPS) transistors and metal oxide transistors as a result of the integration of the LTPS transistors and the metal oxide transistors in large-sized devices in the prior art. That is to say, the oxide semiconductor portions of the switching transistor 200 and the driving transistor 100 are formed of metal oxide, so as to reduce the difficulty of compatibility of the process of the switching transistor 200 and the driving transistor 100. In the prior art, the LTPS transistors require a certain amount of H atoms to passivate the dangling bonds of the silicon film layer body and the interface to reduce semiconductor body and interface defects, and the H atoms may destroy the balance between the oxygen vacancies of the oxide semiconductor in the metal oxide transistor and the metal atom-oxide (M-O) chemical bond, causing a negative Vth shift. However, in the present disclosure, the oxide semiconductor portions of the switching transistor 200 and the driving transistor 100 are both formed of metal oxide, and the H atoms are not required to process the oxide semiconductor portions, thereby avoiding the negative Vth shift. The process of manufacturing the low-temperature poly-silicon oxide (LTPO) is complex. The LTPS and the indium gallium zinc oxide (IGZO) are required to be manufactured separately, and the large-area uniformity of the LTPS is relatively poor. Therefore, it is relatively difficult to apply the LTPO to large-size products. However, in the present disclosure, the oxide semiconductor portions of the switching transistor 200 and the driving transistor 100 are both formed of metal oxide, so that the manufacturing process is simple, and the large-area uniformity of the array substrate 01 can be improved.

In an embodiment, the second oxide semiconductor portion 213 is doped with the one or the combination of two of electronegative metal and an electronegative compound. Further, the second oxide semiconductor portion 213 is doped with the one or the combination of more of rare-earth metal and a fluorine-based compound.

In an embodiment, the rare-earth metal includes one or a combination of more of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), and scandium (Sc). The fluorine-based compound includes one or a combination of more of nitrogen trifluoride, sulfur hexafluoride, carbon tetrafluoride, hexafluoro-1,3-butadiene, hexafluoroethane, perfluoropropane, and trifluoromethane.

In the present disclosure, the first oxide semiconductor portion 111 is doped with the one or the combination of two of electronegative metal and an electronegative compound. That is to say, the first oxide semiconductor portion is doped with the one or the combination of more of rare-earth metal and a fluorine-based compound. In this way, the stability of the driving transistor 100 is improved, so that when the driving transistor 100 is in an on state for a long time, the output current can be kept stable, thereby improving the performance of the array substrate 01.

In an embodiment, mass percentages of the one or the combination of more of the rare-earth metal and the fluorine-based compound in the first oxide semiconductor portion 111 and the second oxide semiconductor portion 213 range from 0.2% to 5%. In detail, the mass percentages of the one or the combination of more of the rare-earth metal and the fluorine-based compound in the first oxide semiconductor portion 111 and the second oxide semiconductor portion 213 are all 0.2%, 1.3%, 2.5%, 3%, 4.7%, 5%, or the like.

In the present disclosure, the mass percentage of the one or the combination of more of the rare-earth metal and the fluorine-based compound in the first oxide semiconductor portion 111 and the second oxide semiconductor portion 213 is set to be in a range of 0.2% to 5%. In this way, the stability of the driving transistor 100 is further improved, so that when the driving transistor 100 is in an on state for a long time, the output current can be kept stable, thereby further improving the performance of the array substrate 01.

In an embodiment, the switching transistor 200 further includes an additional gate insulating portion 214 and a first gate insulating portion 215. The driving transistor 100 further includes a second gate insulating portion 113. The additional gate insulating portion 214, the first gate insulating portion 215, and the second gate insulating portion 113 are all disposed in a same layer and spaced apart from each other. The additional gate insulating portion 214 is disposed on the buffer layer 300 and located in the bridge area 30. The first gate insulating portion 215 is disposed on the second oxide semiconductor portion 213. The second gate insulating portion 113 is disposed on the first oxide semiconductor portion 111. Materials of the additional gate insulating portion 214, the first gate insulating portion 215, and the second gate insulating portion 113 are all insulating materials.

The second gate electrode includes a second sub-gate electrode 216 and a third sub-gate electrode 217 spaced apart from each other. The second sub-gate electrode 216 is located in the bridge area 30 and above the first sub-gate electrode 211. The third sub-gate electrode 217 is located in the main area 20 and above the first light-shielding portion 212. The second sub-gate electrode 216 is disposed on the additional gate insulating portion 214. The third sub-gate electrode 217 is disposed on the first gate insulating portion 215.

In an embodiment, the driving transistor 100 further includes a third gate electrode 114. The third gate electrode 114, the second sub-gate electrode 216, and the third sub-gate electrode 217 are disposed in a same layer and spaced apart from each other. The third gate electrode 114 is disposed on the second gate insulating portion 113.

In an embodiment, materials of the second sub-gate electrode 216, the third sub-gate electrode 217, and the third gate electrode 114 are all conductive materials. The conductive material includes the one or the combination of more of Mo, Ti, Cu, and Al.

An interlayer dielectric layer 400 covers the buffer layer 300, the additional gate insulating portion 214, the second oxide semiconductor portion 213, the first oxide semiconductor portion 111, the second sub-gate electrode 216, the first gate insulating portion 215, the second gate insulating portion 113, the third sub-gate electrode 217, and the third gate electrode 114. The interlayer dielectric layer 400 is provided with a first via 403, a second via 405, a third via 406, a fourth via 404, and a fifth via 407. A first sub-via of the first via 403 penetrates the interlayer dielectric layer 400 and the buffer layer 300 to expose the first sub-gate electrode 211. A second sub-via of the first via 403 penetrates the interlayer dielectric layer 400 to expose the second sub-gate electrode 216. The second via 405 penetrates the interlayer dielectric layer 400 to expose a conductor portion of the second oxide semiconductor portion 213. The third via 406 penetrates the interlayer dielectric layer 400 to expose another conductor portion of the second oxide semiconductor portion 213. A first sub-via of the fourth via 404 penetrates the interlayer dielectric layer 400 and the buffer layer 300 to expose the second light-shielding portion 112. A second via of the fourth via 404 penetrates the interlayer dielectric layer 400 to expose a conductor portion of the first oxide semiconductor portion 111. The fifth via 407 penetrates the interlayer dielectric layer 400 to expose an other conductor portion of the first oxide semiconductor portion 111.

In an embodiment, a material of the interlayer dielectric layer 400 includes one or a combination of more of aluminum oxide, silicon nitride, and silicon oxide. The interlayer dielectric layer 400 may include a plurality of layers.

In an embodiment, the switching transistor 200 further includes a first source electrode 219 and a first drain electrode 220. The driving transistor 100 further includes a second source electrode 115 and a second drain electrode 116. The connecting portion 218, the first source electrode 219, the first drain electrode 220, the second source electrode 115, and the second drain electrode 116 are all disposed in a same layer on the interlayer dielectric layer 400 and spaced apart from each other. The connecting portion 218 is located in the bridge area extends into the first sub-via of the first via 403 to be connected to the first sub-gate electrode 211, and extends into the second sub-via of the first via 403 to be connected to the second sub-gate electrode 216. The first source electrode 219 extends into the second via 405 to be connected to a conductor portion of the second oxide semiconductor portion 213. The first drain electrode 220 extends into the third via 406 to be connected to an other conductor portion of the second oxide semiconductor portion 213. One end of the second source electrode 115 extends into the first sub-via of the fourth via 404 to be connected to the second light-shielding portion 112. An other end of the second source electrode 115 extends into the second sub-via of the fourth via 404 to be connected to a conductor portion of the first oxide semiconductor portion 111. The second drain electrode 116 extends into the fifth via 407 to be connected to an other conductor portion of the first oxide semiconductor portion 111.

In an embodiment, materials of the connecting portion 218, the first source electrode 219, the first drain electrode 220, the second source electrode 115, and the second drain electrode 116 are all conductive materials. The conductive material includes the one or the combination of more of Mo, Ti, Cu, and Al.

In the present disclosure, the first sub-gate electrode 211 and the second sub-gate electrode 216 of the switching transistor 200 are connected by the connecting portion 218, so that the switching transistor 200 realizes dual-gate control, thereby improving the mobility of the switching transistor 200. In this way, when the switching transistor 200 is in an off state for a long time, the speed of writing electrical signals into the driving transistor 100 can be increased, thereby improving the performance of the array substrate 01. In addition, the first sub-gate electrode 211 and the second sub-gate electrode 216 are located in the bridge area 30, so that the manufacturing process requirements of the array substrate 01 are reduced, thereby facilitating the implementation.

In an embodiment, the array substrate 01 further includes a passivation layer 500 and a first electrode 600. The passivation layer 500 covers the interlayer dielectric layer 400, the connecting portion 218, the first source electrode 219, the first drain electrode 220, the second source electrode 115, and the second drain electrode 116. The passivation layer 500 is provided with a via. The via penetrates the passivation layer 500 to expose the second source electrode 115. The first electrode 600 is disposed on the passivation layer 500 and extends into the via to be connected to the second source electrode 115.

In an embodiment, a material of the passivation layer 500 includes the one or the combination of more of aluminum oxide, silicon nitride, and silicon oxide. The passivation layer 500 may include a plurality of layers.

In an embodiment, a material of the first electrode 600 includes high-permeability metal oxide, and the high-permeability metal oxide includes ITO, IZO, or the like.

Figure 3:
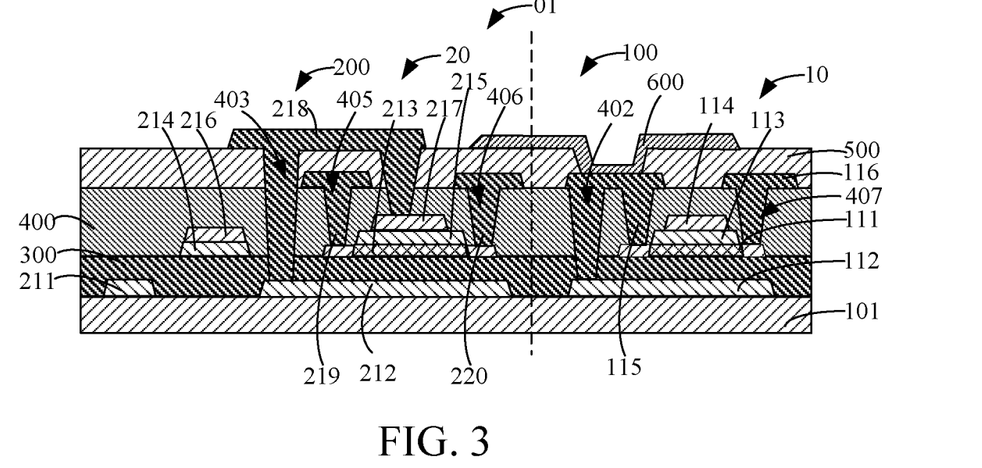
FIG. 3 is a schematic diagram of a second structure of an array substrate according to an embodiment of the present disclosure.

Referring to FIG. 3, FIG. 3 is a schematic diagram of a second structure of an array substrate 01 according to an embodiment of the present disclosure. It should be noted that a difference between the second structure and the first structure is that no additional area is disposed in the switching transistor 200, so that the first sub-gate electrode is connected to the second sub-gate electrode, and the first sub-gate electrode, the second sub-gate electrode, and the additional gate insulating portion are not disposed. The first sub-via of the first via 403 penetrates the interlayer dielectric layer 400 and the buffer layer 300 to expose the first light-shielding portion 212, and the second sub-via of the first via 403 penetrates the interlayer dielectric layer 400 to expose the third sub-gate electrode 217. The connecting portion 218 is disposed on the passivation layer 500 and located above the first source electrode 219 or the first drain electrode 220, and connects the first gate electrode to the second gate electrode. That is to say, the connecting portion 218 connects the first light-shielding portion 212 to the third sub-gate electrode 217.

In the present disclosure, the bridge area is not additionally disposed to connect the first gate electrode to the second gate electrode, so that the high mobility of the switching transistor 200 is realized, and the occupied area of the non-display area is reduced, thereby facilitating the realization of a narrow bezel design.

The present disclosure provides an array substrate 01. The mobility of the switching transistor 200 is greater than the mobility of the driving transistor 100, and the threshold voltage of the driving transistor 100 is less than the threshold voltage of the switching transistor 200. In detail, the first gate electrode and the second gate electrode of the switching transistor 200 are connected by the connecting portion 218, so that the switching transistor 200 realizes dual-gate control, thereby improving the mobility of the switching transistor 200. In this way, when the switching transistor 200 is in the off state for a long time, the speed of writing electrical signals into the driving transistor 100 can be increased, thereby improving the performance of the array substrate 01, reducing the manufacturing process requirements of the array substrate 01, and facilitating the implementation. In addition, the first oxide semiconductor portion 111 of the driving transistor 100 is doped with the one or the combination of two of electronegative metal and an electronegative compound. That is to say, the first oxide semiconductor portion is doped with the rare-earth metal and the fluorine-based compound. In this way, the stability of the driving transistor 100 is improved, so that when the driving transistor 100 is in an on state for a long time, the output current can be kept stable, thereby improving the performance of the array substrate 01. The oxide semiconductor portions of the switching transistor 200 and the driving transistor 100 are both formed of metal oxide, so as to avoid the problem of the increased difficulty of compatibility in the process of LTPS transistors and metal oxide transistors as a result of the integration of the LTPS transistors and the metal oxide transistors in large-sized devices in the prior art. That is to say, the oxide semiconductor portions of the switching transistor 200 and the driving transistor 100 are formed of metal oxide, so as to reduce the difficulty of compatibility of the process of the switching transistor 200 and the driving transistor 100. The oxide semiconductor portions of the switching transistor 200 and the driving transistor 100 are both formed of metal oxide, and H atoms are not required to process the oxide semiconductor portions, so as to avoid the negative Vth shift. The oxide semiconductor portions of the switching transistor 200 and the driving transistor 100 are both formed of metal oxide, so that the manufacturing process is simple, and the large-area uniformity of the array substrate 01 can be improved.

Figure 4:
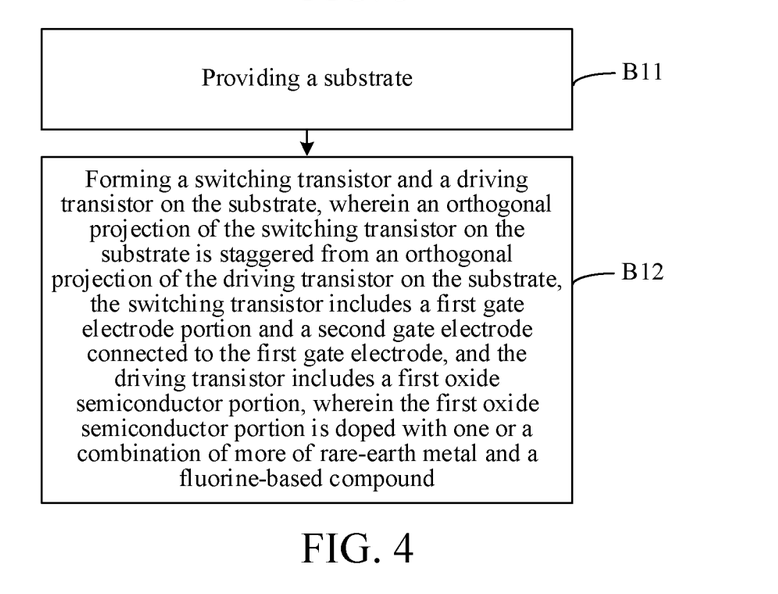
FIG. 4 is a schematic flowchart of a method for manufacturing an array substrate according to an embodiment of the present disclosure.

Refer to FIG. 4 and FIGS. 5 to 12. FIG. 4 is a schematic diagram of a manufacturing process of an array substrate according to an embodiment of the present disclosure. FIGS. 5 to 12 are schematic diagrams of a manufacturing process and a structure of an array substrate according to an embodiment of the present disclosure. The present disclosure further provides a method for manufacturing an array substrate. The method includes steps below.

B11: Providing a substrate.

B12: Forming a switching transistor and a driving transistor on the substrate, wherein an orthogonal projection of the switching transistor on the substrate is staggered from an orthogonal projection of the driving transistor on the substrate.

A mobility of the switching transistor is greater than a mobility of the driving transistor, and a threshold voltage of the driving transistor is less than a threshold voltage of the switching transistor.

In the present disclosure, since the mobility of the transistor used in the switching transistor is greater than the mobility of the driving transistor, and the threshold voltage of the transistor used in the driving transistor is less than the threshold voltage of the switching transistor, the mobility of the switching transistor is improved, and the stability of the driving transistor is enhanced, thereby improving the performance of the array substrate.

Detailed description is given below.

B11: Providing a substrate.

B12: Forming a switching transistor and a driving transistor on the substrate, wherein an orthogonal projection of the switching transistor on the substrate is staggered from an orthogonal projection of the driving transistor on the substrate.

A mobility of the switching transistor is greater than a mobility of the driving transistor, and a threshold voltage of the driving transistor is less than a threshold voltage of the switching transistor.

Figure 5:
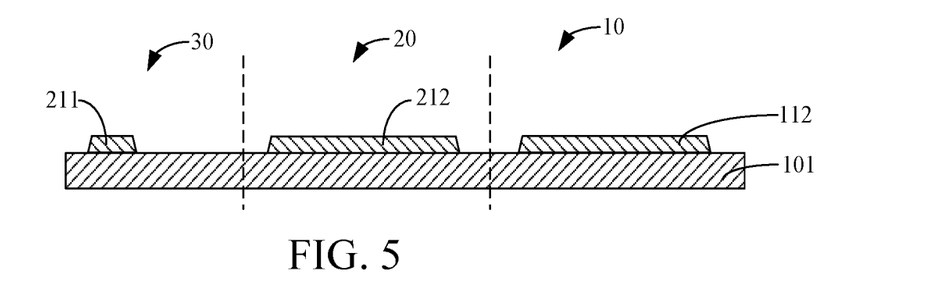
FIGS. 5 to 12 are schematic diagrams of a process and a structure of a method for manufacturing an array substrate according to an embodiment of the present disclosure.

In detail, refer to FIG. 5. A conductive material is formed on the substrate 101 using a physical vapor deposition process, and is patterned to form the first sub-gate electrode 211 of the first gate electrode and the first light-shielding portion 212 and the second light-shielding portion 112 of the first gate electrode that are spaced apart from each other. The first sub-gate electrode 211 is located in the bridge area 30 of the substrate 101. The first light-shielding portion 212 is located in the main area 20 of the substrate 101. The second light-shielding portion 112 is located in the display area 10.

Figure 6:
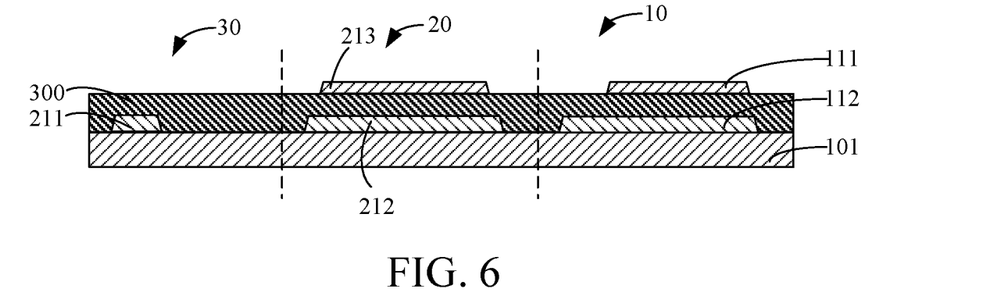

Refer to FIG. 6. Then, the material of the buffer layer 300 is formed on the first sub-gate electrode 211, the first light-shielding portion 212, the second light-shielding portion 112, and the substrate by chemical vapor deposition, and is annealed at a high temperature. The annealing temperature ranges from 300° C. to 400° C., and the annealing time ranges from 2 h to 3 h, so that the buffer layer 300 can be formed. In detail, the annealing temperature may be 300° C., 350° C., 380° C., 400° C., or the like. The annealing time may be 2 h, 2.3 h, 2.8 h, 3 h, or the like.

In the present disclosure, the annealing temperature is set to 300-400° C., and the annealing time is set to 2-3 h, so as to reduce oxygen defects in the buffer layer 300, reduce interface defects between the buffer layer 300 and the first oxide semiconductor portion 111 and the second oxide semiconductor portion 213, and reduce the proportion of weakly bonded oxygen that is not coordinated with silicon, thereby improving the stability of the driving transistor 100 and the switching transistor 200.

Still refer to FIG. 6. Then, a highly stable metal oxide material is formed on the buffer layer 300 and patterned to form the first oxide semiconductor portion 111 and the second oxide semiconductor portion 213 spaced apart from each other. The second oxide semiconductor portion 213 is located in the main area 20. The first oxide semiconductor portion 111 is located in the display area 10.

In an embodiment, the first oxide semiconductor portion 111 is doped with the one or the combination of two of electronegative metal and an electronegative compound. That is to say, the first oxide semiconductor portion is doped with the one or the combination of more of rare-earth metal and a fluorine-based compound. The second oxide semiconductor portion 213 is doped with the one or the combination of two of electronegative metal and an electronegative compound. That is to say, the second oxide semiconductor portion is doped with the one or the combination of more of rare-earth metal and a fluorine-based compound.

In an embodiment, the rare-earth metal includes one or a combination of more of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), and scandium (Sc). The fluorine-based compound includes the one or the combination of more of nitrogen trifluoride, sulfur hexafluoride, carbon tetrafluoride, hexafluoro-1,3-butadiene, hexafluoroethane, perfluoropropane, and trifluoromethane.

Figure 7:
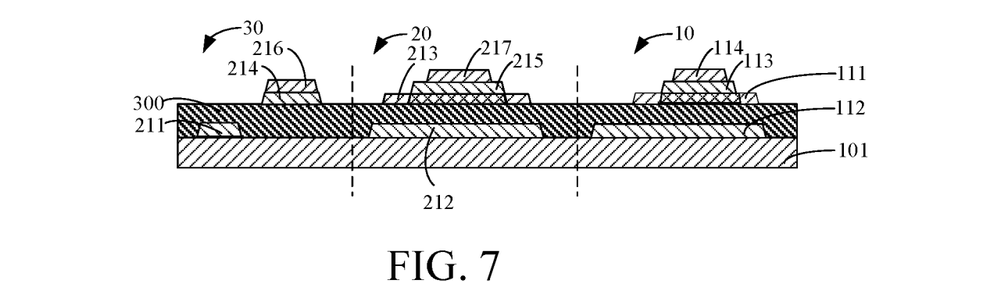

Refer to FIG. 7. Then, an insulating material and a conductive material are sequentially stacked and formed on the buffer layer 300, the first oxide semiconductor portion 111, and the second oxide semiconductor portion 213, and the conductive material is patterned to form the second sub-gate electrode 216 of the second gate electrode, the third sub-gate electrode 217 of the second gate electrode, and the third gate electrode 114. The third sub-gate electrode 217 is located in the main area 20 and above the first light-shielding portion 212. The second sub-gate electrode 216 is disposed on the additional gate insulating portion 214, and the third sub-gate electrode 217 is disposed on the first gate insulating portion 215. The second gate electrode and the third gate electrode 114 are self-aligned to complete the patterning of the additional gate insulating portion 214, the first gate insulating portion 215, and the second gate insulating portion. Then, the first oxide semiconductor portion 111 and the second oxide semiconductor portion 213 are treated using plasma to respectively form body portions and conductor portions of the first oxide semiconductor portion 111 and the second oxide semiconductor portion 213.

Figure 8:
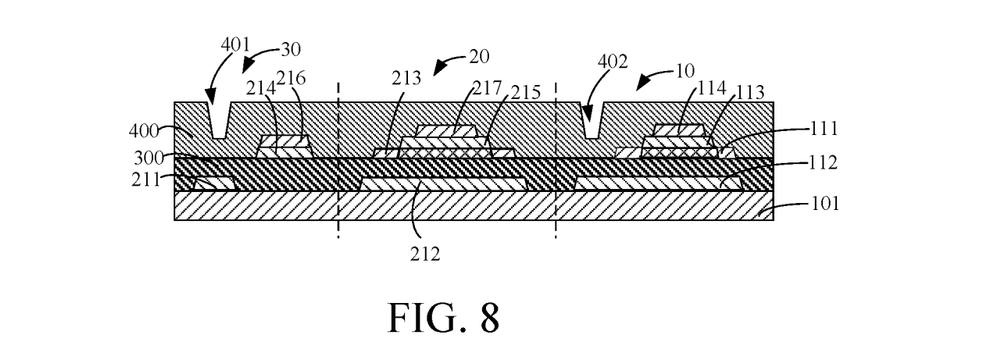

Refer to FIG. 8. The material of the interlayer dielectric layer 400 is formed on the buffer layer 300, the first oxide semiconductor portion 111, the second oxide semiconductor portion 213, the additional gate insulating portion 214, the first gate insulating portion 215, and the second gate insulating portion 113 using a chemical vapor deposition process, and is patterned to form a pattern of the interlayer dielectric layer 400. A first preformed via 401 and a second preformed via 402 penetrating a part of the interlayer dielectric layer 400 are formed on the interlayer dielectric layer 400. The first preformed via 401 is located in the bridge area 30. The second preformed via 402 is located in the display area 10.

Figure 9:
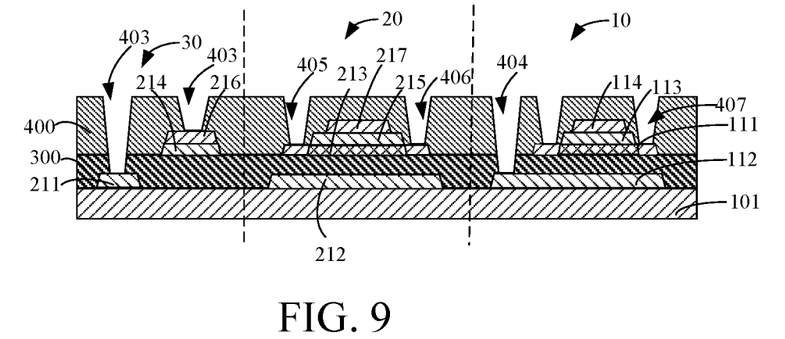

Refer to FIG. 9. The interlayer dielectric layer 400 and the buffer layer 300 are further patterned. The interlayer dielectric layer 400 is provided with a first sub-via of the first via 403, a second sub-via of the first via 403, the second via 405, and the third via 406 that are formed by the first preformed via 401, and a first sub-via of the fourth via 404, the second sub-via of the fourth via 404, and the fifth via 407 that are formed by the second preformed via 402. A first sub-via of the first via 403 penetrates the interlayer dielectric layer 400 and the buffer layer 300 to expose the first sub-gate electrode 211. A second sub-via of the first via 403 penetrates the interlayer dielectric layer 400 to expose the second sub-gate electrode 216. The second via 405 penetrates the interlayer dielectric layer 400 to expose a conductor portion of the second oxide semiconductor portion 213. The third via 406 penetrates the interlayer dielectric layer 400 to expose an other conductor portion of the second oxide semiconductor portion 213. A first sub-via of the fourth via 404 penetrates the interlayer dielectric layer 400 and the buffer layer 300 to expose the second light-shielding portion 112. A second via of the fourth via 404 penetrates the interlayer dielectric layer 400 to expose a conductor portion of the first oxide semiconductor portion 111. The fifth via 407 penetrates the interlayer dielectric layer 400 to expose an other conductor portion of the first oxide semiconductor portion 111.

Figure 10:
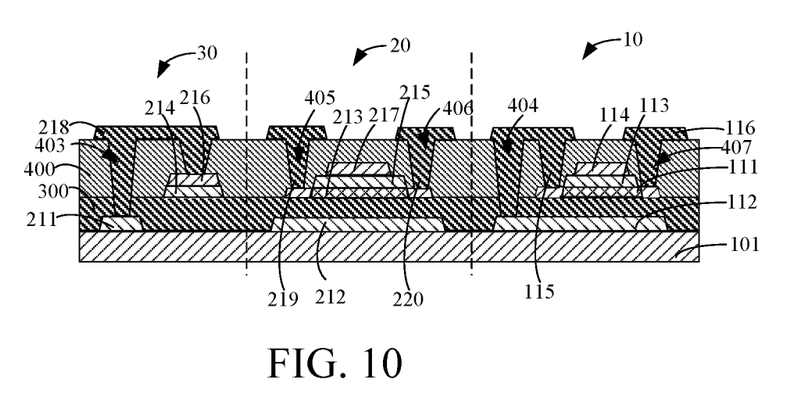

Refer to FIG. 10. A conductive material is formed on the interlayer dielectric layer 400 using a physical vapor deposition process, and is patterned to form the connecting portion 218, the first source electrode 219, the first drain electrode 220, the second source electrode 115, and the second drain electrode 116 that are spaced apart from each other. The connecting portion 218 is located in the bridge area 30, extends into the first sub-via of the first via 403 to be connected to the first sub-gate electrode 211, and extends into the second sub-via of the first via 403 to be connected to the second sub-gate electrode 216. The first source electrode 219 extends into the second via 405 to be connected to a conductor portion of the second oxide semiconductor portion 213. The first drain electrode 220 extends into the third via 406 to be connected to an other conductor portion of the second oxide semiconductor portion 213. One end of the second source electrode 115 extends into the first sub-via of the fourth via 404 to be connected to the second light-shielding portion 112. An other end of the second source electrode 115 extends into the second sub-via of the fourth via 404 to be connected to a conductor portion of the first oxide semiconductor portion 111. The second drain electrode 116 extends into the fifth via 407 to be connected to an other conductor portion of the first oxide semiconductor portion 111. The first gate electrode, the second gate electrode, the second oxide semiconductor portion 213, the additional gate insulating portion 214, the first gate insulating portion 215, the first source electrode 219, and the first drain electrode 220 constitute the switching transistor 200. The first oxide semiconductor portion 111, the second light-shielding portion 112, the second gate insulating portion 113, the third gate electrode 114, the second source electrode 115, and the second drain electrode 116 constitute the driving transistor 100. The first sub-gate electrode 211 and the second sub-gate electrode 216 are connected by the connecting portion 218 in the bridge area 30, so that the switching transistor 200 realizes dual-gate control, thereby improving the mobility of the switching transistor 200. In this way, when the switching transistor 200 is in an off state for a long time, the efficiency of writing electrical signals into the driving transistor 100 can be enhanced.

In an embodiment, the mobility of the switching transistor 200 is 1.5-3 times the mobility of the driving transistor 100, and the threshold voltage of the driving transistor 100 is ⅓-½ of the threshold voltage of the switching transistor 200. In detail, the mobility of the switching transistor 200 may be 1.5 times, 2 times, 2.3 times, or 3 times the mobility of the driving transistor 100, and the threshold voltage of the driving transistor 100 may be ⅓, ⅖, or ½ of the threshold voltage of the switching transistor 200.

In the present disclosure, the mobility of the switching transistor 200 is set to 1.5-3 times the mobility of the driving transistor 100, and the threshold voltage of the driving transistor 100 is set to ⅓-½ of the threshold voltage of the switching transistor 200. In this way, the driving transistor 100 is further caused to have high stability, and the switching transistor 200 is further caused to have high mobility, thereby improving the performance of the array substrate 01.

Figure 11:
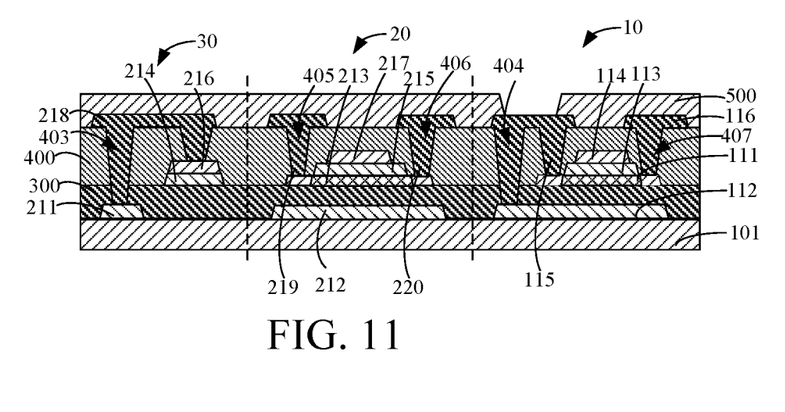

Refer to FIG. 11. The material of the passivation layer 500 is formed and patterned to form the passivation layer 500, and the passivation layer 500 is provided with a via. The via penetrates the passivation layer 500 to expose the second source electrode 115.

Figure 12:
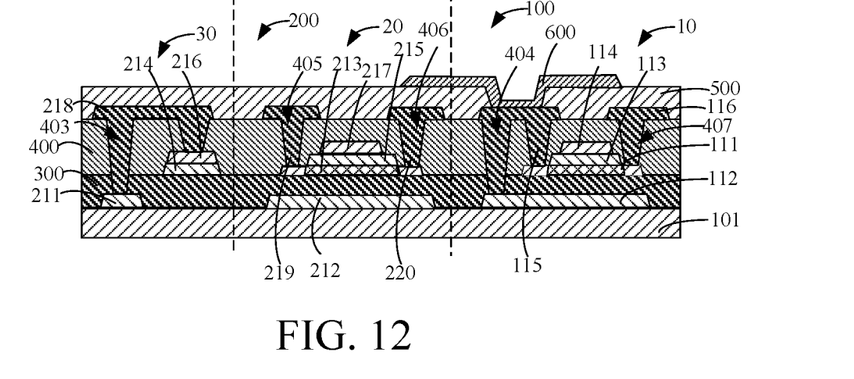

Refer to FIG. 12. A highly transparent metal oxide is disposed on the passivation layer 500, and is patterned to form the first electrode 600. Display elements, such as an organic light emitting diode (OLED) or a mini/micro-LED, can be made on the highly transparent metal oxide.

The present disclosure further provides a display panel. The display panel includes the array substrate provided in the present disclosure and has the features described in the present disclosure.

The present disclosure provides an array substrate 01 and a manufacturing method thereof and a display panel. The mobility of the transistor used by the switching transistor is greater than the mobility of the driving transistor, and the threshold voltage of the transistor used by the driving transistor is less than the threshold voltage of the switching transistor. In detail, the first gate electrode and the second gate electrode of the switching transistor 200 are connected by the connecting portion 218, so that the switching transistor 200 realizes dual-gate control, thereby improving the mobility of the switching transistor 200. In this way, when the switching transistor 200 is in the off state for a long time, the speed of writing electrical signals into the driving transistor 100 can be increased, thereby improving the performance of the array substrate 01, reducing the manufacturing process requirements of the array substrate 01, and facilitating the implementation. In addition, the first oxide semiconductor portion 111 of the driving transistor 100 is doped with the one or the combination of two of electronegative metal and an electronegative compound. That is to say, the first oxide semiconductor portion is doped with the rare-earth metal and the fluorine-based compound. In this way, the stability of the driving transistor 100 is improved, so that when the driving transistor 100 is in an on state for a long time, the output current can be kept stable, thereby improving the performance of the array substrate 01. The oxide semiconductor portions of the switching transistor 200 and the driving transistor 100 are both formed of metal oxide, so as to avoid the problem of the increased difficulty of compatibility in the process of LTPS transistors and metal oxide transistors as a result of the integration of the LTPS transistors and the metal oxide transistors in large-sized devices in the prior art. That is to say, the oxide semiconductor portions of the switching transistor 200 and the driving transistor 100 are formed of metal oxide, so as to reduce the difficulty of compatibility of the process of the switching transistor 200 and the driving transistor 100. The oxide semiconductor portions of the switching transistor 200 and the driving transistor 100 are both formed of metal oxide, and H atoms are not required to process the oxide semiconductor portions, so as to avoid the negative Vth shift. The oxide semiconductor portions of the switching transistor 200 and the driving transistor 100 are both formed of metal oxide, so that the manufacturing process is simple, and the large-area uniformity of the array substrate 01 can be improved.

An array substrate and a manufacturing method thereof, and a display panel provided in the embodiments of the present disclosure are described in detail. The principles and implementations of the present disclosure are described through specific examples in this specification, and the descriptions of the embodiments are only intended to help understand the methods and core ideas of the present disclosure. Meanwhile, a person of skilled in the art may make modifications to the specific implementations and application scopes according to the ideas of the present disclosure. In conclusion, the content of the specification should not be construed as a limitation to the present disclosure.

What is claimed is:
1. An array substrate, comprising:
    a substrate;
    a switching transistor and a driving transistor disposed on the substrate, wherein an orthogonal projection of the switching transistor on the substrate is staggered from an orthogonal projection of the driving transistor on the substrate,
    a mobility of the switching transistor is greater than a mobility of the driving transistor, and a threshold voltage of the driving transistor is less than a threshold voltage of the switching transistor,
    wherein the switching transistor comprises a first gate electrode and a second gate electrode connected to the first gate electrode, and the driving transistor comprises a first oxide semiconductor portion, wherein the first oxide semiconductor portion is doped with one or a combination of two of electronegative metal and an electronegative compound,
    wherein the driving transistor and the switching transistor are both disposed in a same layer on the substrate, and the substrate comprises a display area and a non-display area disposed adjacent to each other, wherein the driving transistor is located in the display area, and the switching transistor is located in the non-display area, and
    wherein the non-display area comprises a bridge area and a main area that are disposed adjacent to each other, wherein the bridge area is located on a side of the main area away from the display area; the first gate electrode comprises a first sub-gate electrode and a first light-shielding portion spaced apart from each other, wherein the first sub-gate electrode is located in the bridge area of the substrate, and the first light-shielding portion is located in the main area of the substrate; and the second gate electrode comprises a second sub-gate electrode and a third sub-gate electrode spaced apart from each other, wherein the second sub-gate electrode is located in the bridge area and above the first sub-gate electrode, the first sub-gate electrode is connected to the second sub-gate electrode, and the third sub-gate electrode is located in the main area and above the first light-shielding portion.

2. The array substrate as claimed in claim 1, wherein the mobility of the switching transistor is 1.5-3 times the mobility of the driving transistor, and the threshold voltage of the driving transistor is ⅓-½ of the threshold voltage of the switching transistor.

3. The array substrate as claimed in claim 1, wherein the first oxide semiconductor portion is doped with one or a combination of more of rare-earth metal and a fluorine-based compound.

4. The array substrate as claimed in claim 1, wherein the switching transistor further comprises a second oxide semiconductor portion, an additional gate insulating portion, a first gate insulating portion, a first source electrode, and a first drain electrode, and the driving transistor further comprises a second light-shielding portion, a second gate insulating portion, a third gate electrode, a second source electrode, and a second drain electrode, wherein
    the first sub-gate electrode, the first light-shielding portion, and the second light-shielding portion are all disposed in a same layer on the substrate and spaced apart from each other, the first sub-gate electrode is located in the bridge area, the first light-shielding portion is located in the main area, and the second light-shielding portion is located in the display area;
    a buffer layer covers the first sub-gate electrode, the first light-shielding portion, the second light-shielding portion, and the substrate;
    the first oxide semiconductor portion and the second oxide semiconductor portion are both disposed in a same layer on the buffer layer and spaced apart from each other, the second oxide semiconductor portion is located in the main area, and the first oxide semiconductor portion is located in the display area;
    the additional gate insulating portion, the first gate insulating portion, and the second gate insulating portion are disposed in a same layer and spaced apart from each other, the additional gate insulating portion is disposed on the buffer layer and located in the bridge area, the first gate insulating portion is disposed on the second oxide semiconductor portion, and the second gate insulating portion is disposed on the first oxide semiconductor portion;
    the second sub-gate electrode, the third sub-gate electrode, and the third gate electrode are disposed in a same layer and spaced apart from each other, the second sub-gate electrode is disposed on the additional gate insulating portion, the third sub-gate electrode is disposed on the first gate insulating portion, and the third gate electrode is disposed on the second gate insulating portion;

an interlayer dielectric layer covers the buffer layer, the additional gate insulating portion, the second oxide semiconductor portion, the first oxide semiconductor portion, the second sub-gate electrode, the first gate insulating portion, the second gate insulating portion, the third sub-gate electrode, and the third gate electrode; and a connecting portion, the first source electrode, the first drain electrode, the second source electrode, and the second drain electrode are all disposed in a same layer on the interlayer dielectric layer and spaced apart from each other, wherein the connecting portion is located in the bridge area and connects the first sub-gate electrode to the second sub-gate electrode, the first source electrode and the first drain electrode are respectively connected to two sides of the second oxide semiconductor portion, the second source electrode is connected to one side of the first oxide semiconductor portion and the second light-shielding portion, and the second drain electrode is connected to an other side of the first oxide semiconductor portion.

5. The array substrate as claimed in claim 4, further comprising a passivation layer and a first electrode, wherein the passivation layer covers the interlayer dielectric layer, the connecting portion, the first source electrode, the first drain electrode, the second source electrode, and the second drain electrode, the first electrode is disposed on the passivation layer, and the first electrode is connected to the second source electrode.

6. The array substrate as claimed in claim 4, wherein the second oxide semiconductor portion is doped with one or a combination of two of electronegative metal and an electronegative compound, and the second oxide semiconductor portion is doped with one or a combination of more of rare-earth metal and a fluorine-based compound.

7. The array substrate as claimed in claim 6, wherein a mass percentage of the one or the combination of more of the rare-earth metal and the fluorine-based compound in the first oxide semiconductor portion ranges from 0.2% to 5%, and a mass percentage of the one or the combination of more of the rare-earth metal and the fluorine-based compound in the second oxide semiconductor portion ranges from 0.2% to 5%.

8. The array substrate as claimed in claim 1, wherein the switching transistor further comprises a second oxide semiconductor portion, a first gate insulating portion, a first source electrode, a first drain electrode, and the driving transistor further comprises a second gate insulating portion, a third gate electrode, a second source electrode, a second drain electrode, and a second light-shielding portion;

the first gate electrode and the second light-shielding portion are both disposed in a same layer on the substrate and spaced apart from each other, the first gate electrode is located in the non-display area, and the second light-shielding portion is located in the display area;

a buffer layer covers the first gate electrode and the second light-shielding portion;

the first oxide semiconductor portion and the second oxide semiconductor portion are both disposed in a same layer on the buffer layer and spaced apart from each other, the second oxide semiconductor portion is located above the first gate electrode, and the first oxide semiconductor portion is located above the second light-shielding portion;

the first gate insulating portion and the second gate electrode are sequentially stacked on the second oxide semiconductor portion;

the second gate insulating portion and the third gate electrode are sequentially stacked on the first oxide semiconductor portion;

an interlayer dielectric layer covers the buffer layer, the first oxide semiconductor portion, the second oxide semiconductor portion, the first gate insulating portion, the second gate insulating portion, the second gate electrode, and the third gate electrode;

the first source electrode, the first drain electrode, the second source electrode, and the second drain electrode are all disposed in a same layer on the interlayer dielectric layer and spaced apart from each other, the first source electrode and the first drain electrode are connected to the second oxide semiconductor portion, the second source electrode is connected to one side of the first oxide semiconductor portion and the second light-shielding portion, and the second drain electrode is connected to an other side of the first oxide semiconductor portion;

a passivation layer covers the interlayer dielectric layer, the first source electrode, the first drain electrode, the second source electrode, and the second drain electrode; and a connecting portion is disposed on the passivation layer and located above the first source electrode or the first drain electrode, and connects the first gate electrode to the second gate electrode.

9. A method for manufacturing an array substrate, comprising following steps:

providing a substrate;

forming a switching transistor and a driving transistor on the substrate, wherein an orthogonal projection of the switching transistor on the substrate is staggered from an orthogonal projection of the driving transistor on the substrate, a mobility of the switching transistor is greater than a mobility of the driving transistor, and a threshold voltage of the driving transistor is less than a threshold voltage of the switching transistor, wherein the switching transistor comprises a first gate electrode and a second gate electrode connected to the first gate electrode, and the driving transistor comprises a first oxide semiconductor portion, wherein the first oxide semiconductor portion is doped with one or a combination of two of electronegative metal and an electronegative compound, wherein the driving transistor and the switching transistor are both disposed in a same layer on the substrate, and the substrate comprises a display area and a non-display area disposed adjacent to each other, wherein the driving transistor is located in the display area, and the switching transistor is located in the non-display area, and wherein the non-display area comprises a bridge area and a main area that are disposed adjacent to each other, wherein the bridge area is located on a side of the main area away from the display area; the first gate electrode comprises a first sub-gate electrode and a first light-shielding portion spaced apart from each other, wherein the first sub-gate electrode is located in the bridge area of the substrate, and the first light-shielding portion is located in the main area of the substrate; and the second gate electrode comprises a second sub-gate electrode and a third sub-gate electrode spaced apart from each other, wherein the second sub-gate electrode is located in the bridge area and above the first sub-gate electrode, the first sub-gate electrode is connected to the second sub-gate electrode, and the third sub-gate electrode is located in the main area and above the first light-shielding portion.

10. The method for manufacturing an array substrate as claimed in claim 9, wherein the driving transistor comprises a first oxide semiconductor portion, wherein the first oxide semiconductor portion is doped with one or a combination of two of electronegative metal and an electronegative compound.

11. A display panel, comprising the array substrate, wherein the array substrate comprises:
a substrate;
a switching transistor and a driving transistor disposed on the substrate, wherein an orthogonal projection of the switching transistor on the substrate is staggered from an orthogonal projection of the driving transistor on the substrate,
a mobility of the switching transistor is greater than a mobility of the driving transistor, and a threshold voltage of the driving transistor is less than a threshold voltage of the switching transistor,
wherein the switching transistor comprises a first gate electrode and a second gate electrode connected to the first gate electrode, and the driving transistor comprises a first oxide semiconductor portion, wherein the first oxide semiconductor portion is doped with one or a combination of two of electronegative metal and an electronegative compound,
wherein the driving transistor and the switching transistor are both disposed in a same layer on the substrate, and the substrate comprises a display area and a non-display area disposed adjacent to each other, wherein the driving transistor is located in the display area, and the switching transistor is located in the non-display area, and
wherein the non-display area comprises a bridge area and a main area that are disposed adjacent to each other, wherein the bridge area is located on a side of the main area away from the display area; the first gate electrode comprises a first sub-gate electrode and a first light-shielding portion spaced apart from each other, wherein the first sub-gate electrode is located in the bridge area of the substrate, and the first light-shielding portion is located in the main area of the substrate; and the second gate electrode comprises a second sub-gate electrode and a third sub-gate electrode spaced apart from each other, wherein the second sub-gate electrode is located in the bridge area and above the first sub-gate electrode, the first sub-gate electrode is connected to the second sub-gate electrode, and the third sub-gate electrode is located in the main area and above the first light-shielding portion.

12. The display panel as claimed in claim 11, wherein the mobility of the switching transistor is 1.5-3 times the mobility of the driving transistor, and the threshold voltage of the driving transistor is ⅓-½ of the threshold voltage of the switching transistor.

13. The display panel as claimed in claim 11, wherein the first oxide semiconductor portion is doped with one or a combination of more of rare-earth metal and a fluorine-based compound.

14. The display panel as claimed in claim 11, wherein the switching transistor further comprises a second oxide semiconductor portion, an additional gate insulating portion, a first gate insulating portion, a first source electrode, and a first drain electrode, and the driving transistor further comprises a second light-shielding portion, a second gate insulating portion, a third gate electrode, a second source electrode, and a second drain electrode, wherein
the first sub-gate electrode, the first light-shielding portion, and the second light-shielding portion are all disposed in a same layer on the substrate and spaced apart from each other, the first sub-gate electrode is located in the bridge area, the first light-shielding portion is located in the main area, and the second light-shielding portion is located in the display area; a buffer layer covers the first sub-gate electrode, the first light-shielding portion, the second light-shielding portion, and the substrate;
the first oxide semiconductor portion and the second oxide semiconductor portion are both disposed in a same layer on the buffer layer and spaced apart from each other, the second oxide semiconductor portion is located in the main area, and the first oxide semiconductor portion is located in the display area;
the additional gate insulating portion, the first gate insulating portion, and the second gate insulating portion are disposed in a same layer and spaced apart from each other, the additional gate insulating portion is disposed on the buffer layer and located in the bridge area, the first gate insulating portion is disposed on the second oxide semiconductor portion, and the second gate insulating portion is disposed on the first oxide semiconductor portion;
the second sub-gate electrode, the third sub-gate electrode, and the third gate electrode are disposed in a same layer and spaced apart from each other, the second sub-gate electrode is disposed on the additional gate insulating portion, the third sub-gate electrode is disposed on the first gate insulating portion, and the third gate electrode is disposed on the second gate insulating portion;
an interlayer dielectric layer covers the buffer layer, the additional gate insulating portion, the second oxide semiconductor portion, the first oxide semiconductor portion, the second sub-gate electrode, the first gate insulating portion, the second gate insulating portion, the third sub-gate electrode, and the third gate electrode; and
a connecting portion, the first source electrode, the first drain electrode, the second source electrode, and the second drain electrode are all disposed in a same layer on the interlayer dielectric layer and spaced apart from each other, wherein the connecting portion is located in the bridge area and connects the first sub-gate electrode to the second sub-gate electrode, the first source electrode and the first drain electrode are respectively connected to two sides of the second oxide semiconductor portion, the second source electrode is connected to one side of the first oxide semiconductor portion and the second light-shielding portion, and the second drain electrode is connected to an other side of the first oxide semiconductor portion.

\* \* \* \* \*